(12) United States Patent  
Neumann et al.

(10) Patent No.: US 7,740,209 B2  
(45) Date of Patent: Jun. 22, 2010

(54) CABLE ROUTING DEVICE

(75) Inventors: Matt Neumann, Roseville, CA (US);  
Michael Brooks, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 11/878,861

(22) Filed: Jul. 27, 2007

(65) Prior Publication Data

US 2009/0026322 A1  Jan. 29, 2009

(51) Int. Cl.  
*F16L 3/00* (2006.01)

(52) U.S. Cl. .......................... 248/49; 248/65; 248/68.1

(58) Field of Classification Search .................. 248/49, 248/68.1, 65, 73, 74.2, 51, 219.2; 174/68.1, 174/135, 250, 72 A  
See application file for complete search history.

(56) References Cited

U.S. PATENT DOCUMENTS

| | | | | |
|---|---|---|---|---|
| 4,369,947 A | * | 1/1983 | Kuwano | 248/74.2 |
| 5,458,303 A | * | 10/1995 | Ruckwardt | 248/74.2 |
| 6,070,836 A | * | 6/2000 | Battie et al. | 248/68.1 |
| 6,408,492 B1 | * | 6/2002 | Sparks et al. | 248/336 |
| 6,427,952 B2 | * | 8/2002 | Caveney et al. | 248/68.1 |
| 6,443,402 B1 | * | 9/2002 | Ferrill et al. | 248/65 |
| 6,631,875 B1 | * | 10/2003 | Kampf et al. | 248/68.1 |
| 6,631,876 B1 | * | 10/2003 | Phillips | 248/74.2 |
| 6,752,426 B2 | * | 6/2004 | Kacines et al. | 280/782 |
| 7,255,310 B2 | * | 8/2007 | Niwa et al. | 248/75 |
| 2004/0188569 A1 | * | 9/2004 | Bauer | 248/68.1 |
| 2005/0121559 A1 | * | 6/2005 | King | 248/68.1 |
| 2007/0187555 A1 | * | 8/2007 | Rabanin | 248/49 |
| 2008/0099635 A1 | * | 5/2008 | Laursen | 248/68.1 |

* cited by examiner

*Primary Examiner*—Ramon O Ramirez

(57) ABSTRACT

A cable routing device for installation on a post of a computing system board, includes a tube shaped main body having a hollow inner cavity. The main body includes a lower generally cylindrical portion having a first inner diameter sized to achieve a clearance fit over the post, and a flexible upper portion having a general shape of a truncated cone when in an unflexed condition, the flexible upper portion having slits arranged approximately opposite to each other thereby defining two sides to the flexible upper portion, the flexible upper portion having a second inner diameter proximate to a top of the flexible upper portion. When the flexible upper portion is in the unflexed condition, the second inner diameter is smaller than the first inner diameter and smaller than an effective diameter of the post, and when the two sides are flexed in an outward direction the device achieves a clearance fit over the post. The device further includes a cable clip molded to the main body, and configured to retain a plurality of cables.

18 Claims, 3 Drawing Sheets

CABLE ROUTING DEVICE

BACKGROUND

A computing system board carries many components, some of which are coupled by cables routed over the board. To provide proper airflow, prevent damage to the components, and to permit proper installation on the board, such cables typically are clamped to posts attached to the board. Posts can be threaded on to the board at various locations. However, such locations may not always be favorable to cable routing.

DESCRIPTION OF THE DRAWINGS

The detailed description will refer to the following drawings in which like numerals refer to like items, and in which.

DETAILED DESCRIPTION

Various embodiments of a herein-described cable routing device may be used to efficiently and securely route cables, such as might be used on a computing system board, so that the cable are placed in the optimum position with respect to maintaining proper airflow, minimizing cable length, and minimizing possible tangling of cables, for example. The device also prevents the inadvertent release of the cables, which could interfere with airflow and damage components of the computing system. To provide these functions, the cable routing device is designed to fit over a post on a computing system board, achieving a first, or clearance, fit when initially (partly) installed so that the device may rotate freely about the post to allow an attached cable clip to be positioned in the best possible orientation to control cable routing. (When a clearance fit is made, a space always exists between the cable routing device and the post.) When fully installed on the post, the cable routing device is designed not to rotate and not to fall off the post, should the computing system board be turned upside down, for example. To prevent rotation and to ensure full retention on the post, regardless of the orientation of the post, an embodiment of the device achieves an interference fit when fully inserted. Generally, an interference fit occurs when two parts are forced together. An interference fit may rely on frictional forces between two or more parts that have been forced together to prevent movement. Alternately, or in addition, an interference fit may rely on, for example, compressive or tensile forces created when two or more parts are forced together. Another embodiment uses a system of flanges and corresponding projections to ensure retention. The flanges and projections achieve a mechanical fit that prevents movement in at least one axis. For example, this arrangement may prevent vertical movement of a cable routing device on a post, but may not prevent rotation of the device on the post. In addition, this embodiment may use an interference fit of the flanges and projections, or an interference fit of the device main body and the post, to prevent rotation. Yet another embodiment may use a system of vertical groves and projections on an upper part of the inner surface of the cable routing device and corresponding grooves and projections on the post to prevent rotation of the device, and optionally, to ensure retention of the device on the post.

Figure 1:
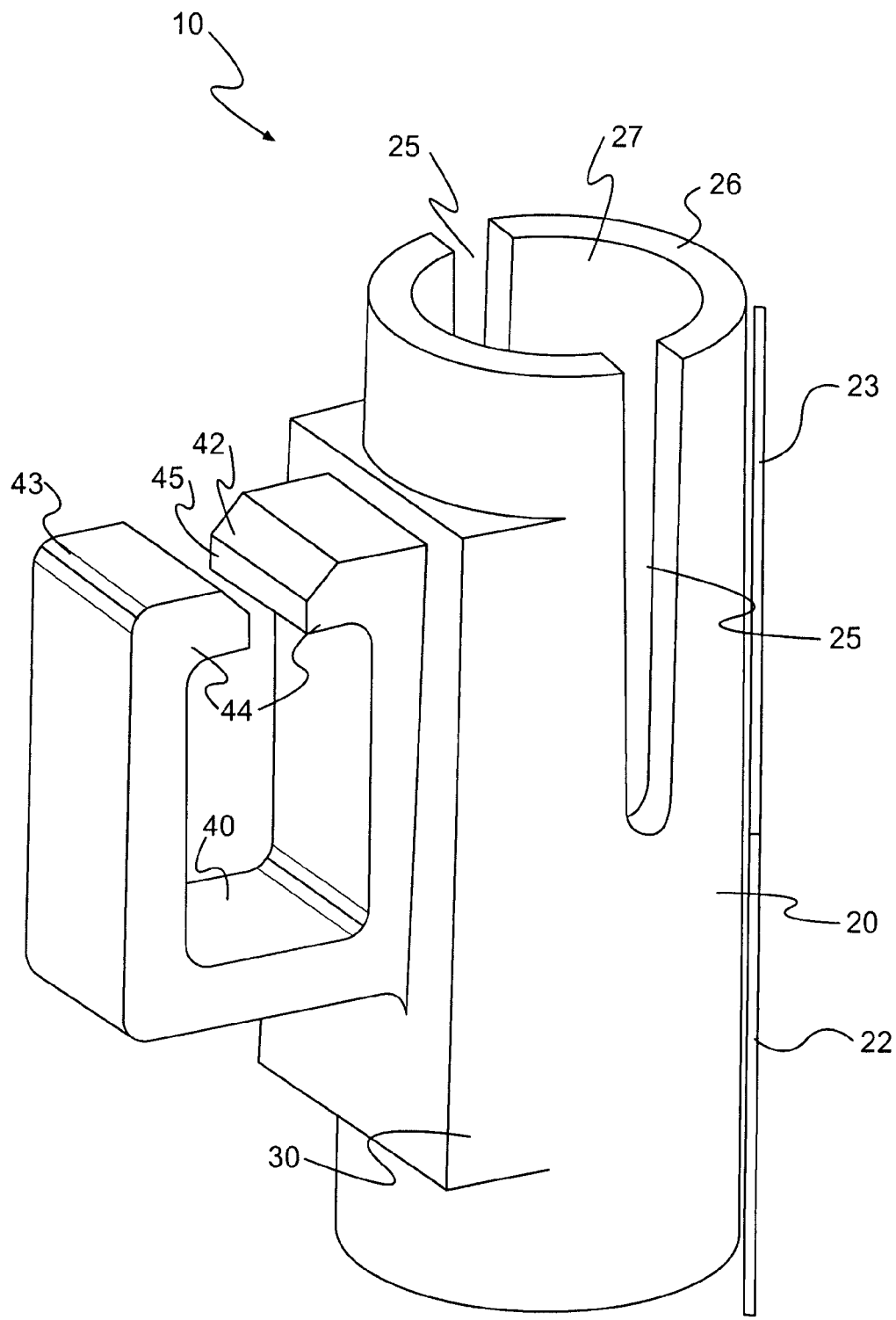
FIG. 1 illustrates an exemplary cable routing device.

FIG. 1 illustrates an exemplary cable routing device 10 that can be used to secure cables connecting components of a computing system board. The device 10 includes a generally cylindrical, hollow (tube-shaped) main body 20 having a lower portion 22 and an upper portion 23. Attached to an exterior surface of main body 20 is cable clip support plate 30 and cable clip 40. In an embodiment, the cable clip support plate 30, the cable clip 40, and the main body 20 are molded as a one piece unit. Processes and compositions for molding the device 10 as a single unit are well known to those of ordinary skill in the art.

The cable clip 40 is generally rectangular in shape, having a fixed prong 42, which is fixedly attached (e.g. molded) to the cable clip support plate 30, and a flexible prong 43, which is designed to flex in a direction away from the fixed prong 42. Attached to a top of each of the prongs 42 and 43 are retainers 44, which define an opening 45 at a top of the cable clip 40. With the flexible prong 43 in an unflexed position, the opening 45 is of a size to prevent any single cable passing through the cable clip 40. By slightly flexing the flexible prong 43, cables can be added or removed from the cable clip 40. Although the cable clip 40 is shown as rectangular, other shapes may be used, including generally circular, oval, and square, for example. Furthermore, although the device 10 is shown with one cable clip 40, an alternate device may have installed two cable clips, spaced, for example, 180 degrees apart. However, use of a single cable clip 40 provides maximum flexibility in terms of positioning the device 10 on a post of a computing system board.

As noted above, the main body 20 includes a lower portion 22 and an upper portion 23. The lower portion 22 has a first inner diameter that is larger than an effective diameter of a post (not shown in FIG. 1) over which the device 10 is to be fitted, with the size differential such that the lower portion 22 achieves a clearance fit over the post. Sides 26 of the upper portion 23 taper slightly such that the upper portion 23 forms a truncated cone with a second inner diameter at a top 27 of the upper portion 23 slightly smaller than the first inner diameter and also slightly smaller than an effective diameter of the post.

The upper portion 23 also includes slits 25, formed approximately 180 degrees apart, and extending downward from the top 27 of the upper portion 23 to at or near a bottom of the upper portion 23. The slits 25 allow the sides 26 of the upper portion 23 to flex apart slightly during installation of the device 10 on the post. Thus, the second inner diameter is sized to achieve an interference fit when the device 10 is installed over the post. Other arrangements of slits may be used with the device 10. For example, the device 10 may have three slits spaced approximately 120 degrees apart.

Figure 2:
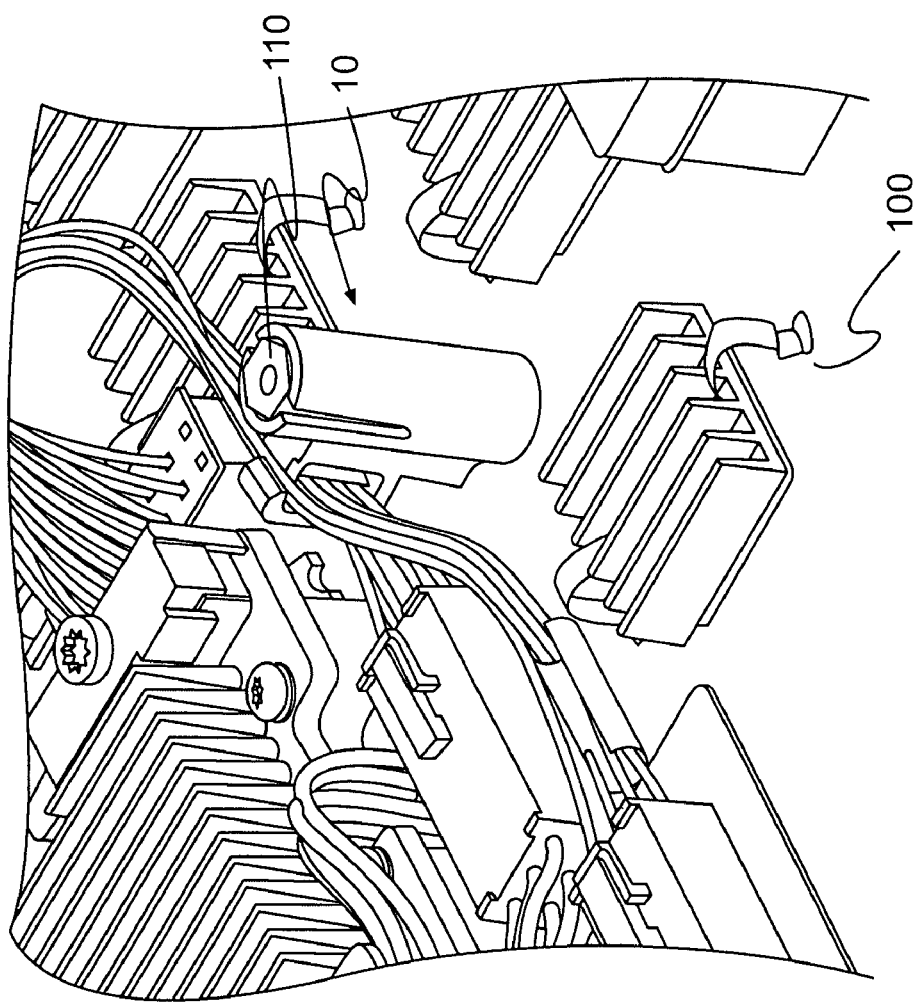
FIG. 2 illustrates the cable routing device of FIG. 1 installed on a post of a computing system board.

FIG. 2 illustrates the device 10 installed on computing system board 100 over post 110. The post 110 is shown as six-sided, but could be of other shapes, including cylindrical, for example. To install the device 10 over the post 110, a user slides the device 10 onto the post 110 about halfway down the post 110. At this position, there is no interference between the post 110 and the device 10. That is, the clearance fit allows easy rotation of the device 10 about the post 110 so as to achieve optimum positioning of the cable clip 40 with respect to cables to be restrained. With the device 10 in the clearance fit position, the user then can orient the device 10 to the correct position for carrying the cables before proceeding with final installation of the device 10. As noted above, the upper portion 23 is designed to have an interference fit with the post 110. As the device 10 is pushed past the approximately halfway point on the post 110, the interference of the post 110 begins to push on the inside of the device's upper portion 23. When this occurs, the slits 25 allow for the sides 26 of the upper portion 23 of the device 10 to flex apart with the result that the device 10 fits snuggly on the post 110 and eliminates any possible rotation of the device 10 on the post 110.

In addition to fitting snug on the post 110 so as to remain in it's desired orientation, the device 10, by using the above-described cable clip 40, is able to restrain a plurality of cables while allowing easy installation and removal of individual cables. Furthermore, because the cable clip 40 and main body 20 are molded as a single unit, the risk that the cable clip 40 will become unattached and in a position to damage the computer system's components is eliminated.

In an alternative to the main body configuration shown in FIG. 1, and described above, an alternate cable routing device (not shown) replaces the main body 20 with a main body in an overall shape of a truncated cone. The alternative configuration includes slits disposed on an upper half of the main body so that slight flexion of the upper half occurs when the device is fully inserted onto the post 110 of FIG. 2. Thus, when partially inserted onto the post 110, the alternative device achieves a clearance fit, and as the device approaches full insertion, an interference fit is achieved.

In yet another alternative to the main body configuration shown in FIG. 1, the main body is in the shape to a truncated cone without slits. In this embodiment, the interference fit is achieved just as the main body becomes fully inserted onto the post.

Figure 3:
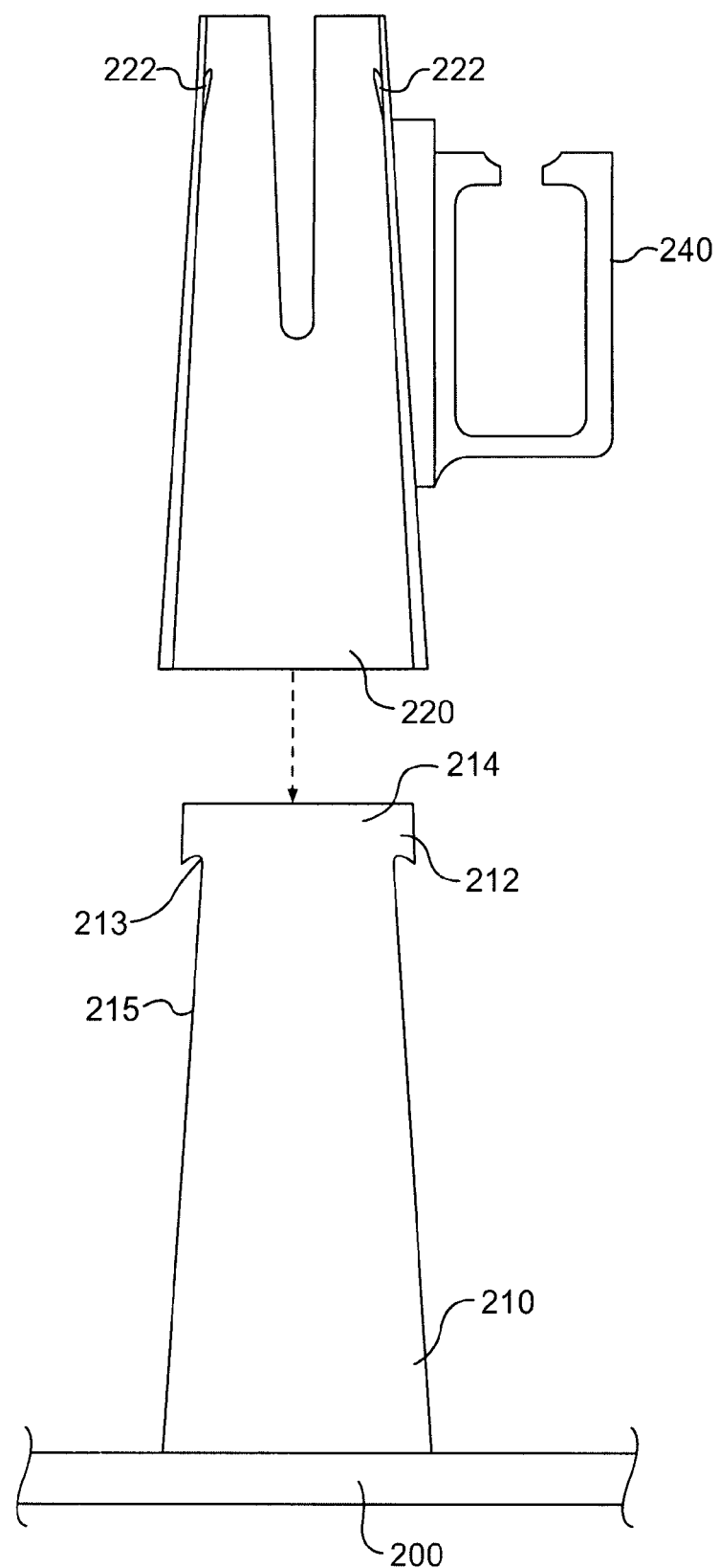
FIG. 3 illustrates another embodiment of a cable routing device, and an associated computing system board post.

FIG. 3 illustrates an another embodiment of a cable routing device. As can be seen, post 210 is meant for installation on computing system board 200. The post 210 includes downwardly projecting flange 212 that continues around all or part of the circumference of an upper section 214 of the post 210. The flange 212 defines a cavity 213 between the flange 212 and the outer surface 215 of the post 210. Cable routing device 220 is a hollow, generally cylindrical or conical device that includes projections 222 pointing in an up direction (i.e., opposite the direction of the flanges 212), and shaped to fit in the cavity 213 when the cable routing device 220 is fully inserted on the post 210. Thus, the post 210 and device 220 achieve a snap fit when the device 220 is fully installed on the post 210. Optionally, to prevent rotation of the device 220 on the post 210, in addition to the snap fit, the clearance between the post 210 and the device 220, when fully assembled, may be such that frictional forces will overcome any angular momentum that normally would exist on the board 200. In yet another alternative arrangement, the post 210 and the device 220 are fabricated with complementary sloping or angled surfaces (i.e., the device 220 has a shape of a truncated cone). As such, when the projections 222 are seated in the cavity 213, the clearance between an inner surface of the device 220 and the outer surface of the post 210 is such that an interference fit is achieved.

Other features of the device 220, including slits 225 and cable clip 240 operate in a manner similar to, or provide a function similar to corresponding elements of the cable routing device 10 of FIG. 1.

In yet another embodiment, a system of vertical grooves and projections are molded onto an upper part of the inner surface of a cable routing device and corresponding grooves and projections are molded onto the post. When the device is partly inserted onto the post, the smooth bottom inner surface of the device does not engage the grooves and projections on the upper part of the post, and rotation of the device about the post is possible. When the device becomes close to its final installation point on the post, the grooves on the top inner surface of the device engage corresponding projections on the post to prevent rotation of the device, and optionally, to ensure retention of the device on the post.

Embodiments of the cable routing device were described for installation on a post of a computing system board. However, the cable routing device is not limited to this specific application and may be adapted for use in a number of other environments, including, for example, for wiring of an automobile, an airplane, or a ship.

We claim:

1. A cable routing device, comprising:
    a tube shaped main body for installation on a post of a computing system board, the tube shaped main body having a hollow inner cavity and comprising:
        a lower generally cylindrical portion having a first inner diameter sized to achieve a clearance fit over the post, and
        a flexible upper portion having a general shape of a truncated cone when in an unflexed condition, the flexible upper portion comprising slits arranged approximately opposite to each other thereby defining two sides to the flexible upper portion, the flexible upper portion having a second inner diameter proximate to a top of the flexible upper portion, wherein when the flexible upper portion is in the unflexed condition, the second inner diameter is smaller than the first inner diameter and smaller than an effective diameter of the post, and wherein the two sides are flexed in an outward direction to achieve an interference fit over the post; and
    a cable clip molded to the main body, the cable clip configured to retain a plurality of cables.

2. The cable routing clip of claim 1, wherein the cable clip comprises a rectangular housing having a flexible prong and a fixed prong, the prongs defining an opening through which the plurality cables are inserted, and wherein the flexible prong is flexed in an outward direction to allow passage of a cable into the out of the rectangular housing.

3. The cable routing device of claim 1, further comprising a second cable slip molded to the main body.

4. A cable routing device, comprising:
    fit means for achieving a first clearance fit and a final fit for installing the device on a post of a computer system board, wherein the final fit is an interference fit, and wherein the fit means comprises a tube-shaped body having a generally cylindrical lower portion and a generally conical upper portion, the upper portion comprising opposed slits that provide for flexion of the upper portion away from a surface of the post so than the interference fit is achieved; and
    means, coupled to the fit means, for securely restraining a plurality of cables.

5. The device of claim 4, wherein the fit means and the restraining means are molded as a single device.

6. The device of claim 4, wherein the fit means, when a clearance fit is achieved, is rotatable about the post and wherein when the final fit is achieved, is not rotatable about the post.

7. The device of claim 4, wherein the post comprises a downwardly projecting flange, and wherein the fit means comprises:
    a tube-shaped body having a hollow, generally conical shape; and
    one or more projections formed on an inner surface of the tube-shaped body, the projections shaped and disposed so as to engage the flange when the tube-shaped body is fully installed on the post.

8. The device of claim 7, wherein the fit between the flange and the one or more projection comprises an interference fit.

9. The device of claim 4, wherein the post comprises one or more grooves and projection in a generally saw-toothed arrangement, and wherein the fit means comprises:
   a tube-shaped body having a hollow, generally cylindrical shape; and
   one or more grooves and projections formed on an upper portion of an inner surface of the tube-shaped body, and sized to engage corresponding grooves and projections on the post.

10. The device of claim 9, wherein engagement of the grooves and projections formed on the tube-shaped body with the corresponding grooves and projection on the post creates an interference fit.

11. A cable routing device, comprising:
   a main body comprising:
      a clearance fit portion to allow precise positioning of the device radially on a post, and
      an interference fit portion to allow non-rotatable positioning of the device on the post, the interference fit portion comprising a flexible upper portion having a general shape of a truncated cone when in an unflexed condition, the flexible upper portion comprising slits arranged approximately opposite to each other thereby defining two sides to the flexible upper portion, the flexible upper portion having a second inner diameter proximate to a top of the flexible upper portion, wherein when the flexible upper portion is in the unflexed condition, the second inner diameter is smaller than the first inner diameter and smaller than effective diameter of the post, and wherein the two sides are flexed in an outward direction to achieve an interference fit over the post; and
   a cable clip having an expandable opening through which a cable may pass.

12. The device of claim 11, wherein the cable clip is molded to the main body.

13. The device of claim 11, wherein he post comprises a downwardly projecting flange, and wherein the interference fit portion comprises.
   a tube-shaped body having a hollow, generally conical shape; and
   one or more projections formed on an inner surface of the tube-shaped body, the projections shaped and disposed so as to engage the flange when the tube-shaped body is fully installed on the post.

14. The device of claim 13, wherein the fit between the flange and the one or more projections comprises an interference fit.

15. The device of claim 11, wherein the posts comprises a one or more grooves and projections in a generally saw-toothed arrangement, and wherein the interference fit portion comprises:
   a tube-shaped body having a hollow, generally cylindrical shape; and
   one or more grooves and projections formed on an upper portion of an inner surface of the tube-shaped body, and sized to engage corresponding grooves and projections on the post.

16. The device of claim 15, wherein engagement of the grooves and projections formed on the tube-shaped body with the corresponding grooves and projections on the post creates an interference fit.

17. The device of claim 11, wherein the main body comprises a tube-shaped structure having a hollow inner cavity.

18. The device of claim 11, wherein the clearance fit portion comprises a lower generally cylindrical portion having a first inner diameter sized to achieve a clearance fit over the post.

* * * * *

UNITED STATES PATENT AND TRADEMARK OFFICE
CERTIFICATE OF CORRECTION

PATENT NO.        : 7,740,209 B2
APPLICATION NO.   : 11/878861
DATED             : June 22, 2010
INVENTOR(S)       : Matt Neumann et al.

Page 1 of 1

It is certified that error appears in the above-identified patent and that said Letters Patent is hereby corrected as shown below:

In column 4, line 35, in Claim 2, delete "into the" and insert -- into and --, therefor.

In column 4, line 37, in Claim 3, delete "slip" and insert -- clip --, therefor.

In column 6, line 3, in Claim 13, delete "he" and insert -- the --, therefor.

In column 6, line 5, in Claim 13, delete "comprises." and insert -- comprises: --, therefor.

Signed and Sealed this
Twenty-eighth Day of December, 2010

David J. Kappos
*Director of the United States Patent and Trademark Office*